United States Patent
Zheng et al.

(10) Patent No.: US 8,987,750 B2
(45) Date of Patent: Mar. 24, 2015

(54) LED CHIP PACKAGING STRUCTURE, ITS MANUFACTURING METHOD, AND DISPLAY DEVICE

(71) Applicants: Boe Technology Group Co., Ltd., Beijing (CN); Beijing Boe Chatani Electronics Co., Ltd., Beijing (CN)

(72) Inventors: Weixin Zheng, Beijing (CN); Guoheng Ma, Beijing (CN); Dongsheng Yang, Beijing (CN); Zhonglian Qiao, Beijing (CN)

(73) Assignees: Boe Technology Group Co., Ltd., Beijing (CN); Beijing Boe Chatani Electronics Co., Ltd., Beijing (CN)

( * ) Notice: Subject to any disclaimer, the term of this patent is extended or adjusted under 35 U.S.C. 154(b) by 0 days.

(21) Appl. No.: 14/105,571

(22) Filed: Dec. 13, 2013

(65) Prior Publication Data
US 2014/0167063 A1 Jun. 19, 2014

(30) Foreign Application Priority Data
Dec. 14, 2012 (CN) .......................... 2012 1 0545538

(51) Int. Cl.
*H01L 33/22* (2010.01)
*H01L 33/32* (2010.01)
*H01L 33/62* (2010.01)
*H01L 33/64* (2010.01)
*H01L 23/00* (2006.01)

(52) U.S. Cl.
CPC ............... *H01L 33/32* (2013.01); *H01L 33/62* (2013.01); *H01L 33/647* (2013.01); *H01L 24/95* (2013.01); *H01L 2933/0066* (2013.01); *H01L 2933/0075* (2013.01)
USPC .................................. 257/76; 438/26; 438/28

(58) Field of Classification Search
CPC ........................................................ H01L 33/32
USPC ........................................ 257/76; 438/28, 26
See application file for complete search history.

(56) References Cited

U.S. PATENT DOCUMENTS

2013/0056757 A1* 3/2013 Miyachi et al. ................. 257/88

FOREIGN PATENT DOCUMENTS

| CN | 102148312 A | 8/2011 |
| CN | 102593287 A | 7/2012 |

OTHER PUBLICATIONS

Chinese Patent Application No. 2012105455381, Office Action dated Nov. 19, 2014, six (6) pages, English translation Attached.

*Primary Examiner* — Marc Armand
(74) *Attorney, Agent, or Firm* — Nath, Goldberg & Meyer; Jerald L. Meyer; Tiffany A. Johnson

(57) ABSTRACT

A LED chip packaging structure, its manufacturing method, and a display device are disclosed. A conductive unit is formed at two opposite sides of a LED chip unit, and comprises a first conductive layer formed at a side of, and electrically connected to, a first electrode, a second conductive layer formed at a side of, and electrically connected to, a second electrode, and an intermediate isolation layer formed at a side of a GaN layer. The LED chip unit and the conductive unit are connected laterally to form an electrical-connection channel as a whole, without welding a gold wire for the conductive channel as in a traditional LED. Thus, the method is able to reduce the total thickness of the LED chip device, increase the thermal conductivity effect of the LED chip and the overall stability, and improve the light-extraction effect of the surface of the LED chip.

18 Claims, 7 Drawing Sheets

```
┌─────────────────────────────────────────────────────┐
│ securing the LED chip units at regular intervals in │
│ the supporting frame, the LED chip unit being       │
│ provided with the first electrode, the GaN layer    │── 3a
│ and the second electrode, the GaN layer being       │
│ formed between the first electrode and the second   │
│ electrode, and the first electrode being formed on  │
│ the GaN layer                                       │
└─────────────────────────────────────────────────────┘
                          │
                          ▼
┌─────────────────────────────────────────────────────┐
│ forming the second conductive layer included in     │
│ the conductive unit of the LED chip packaging       │
│ structure in a region of an upper surface of the    │── 3b
│ supporting frame corresponding to an isolation part │
│ between any two adjacent LED chip units, the        │
│ second conductive layer being electrically          │
│ connected to the second electrode                   │
└─────────────────────────────────────────────────────┘
                          │
                          ▼
┌─────────────────────────────────────────────────────┐
│ forming the intermediate isolation layer included   │── 3c
│ in the conductive unit on the second conductive     │
│ layer                                               │
└─────────────────────────────────────────────────────┘
                          │
                          ▼
┌─────────────────────────────────────────────────────┐
│ forming the first conductive layer included in the  │── 3d
│ conducting unit on the intermediate isolation       │
│ layer, the first conductive layer being             │
│ electrically connected to the first electrode       │
└─────────────────────────────────────────────────────┘
```

LED CHIP PACKAGING STRUCTURE, ITS MANUFACTURING METHOD, AND DISPLAY DEVICE

CROSS-REFERENCE TO RELEVANT APPLICATION

The present application claims a priority of the Chinese patent application No. 201210545538.1 filed on Dec. 14, 2012, which is incorporated herein by reference in its entirety.

TECHNICAL FIELD

The embodiments of the present invention relate to the field of LED packaging technology, in particular to a LED chip packaging structure, its manufacturing method and a display device.

BACKGROUND

The occurrence of semiconductor light-emitting diode (LED) leads to a reform of the lighting industry once again. Due to the advantages such as miniaturization and solidification, vibration resistance, fast instant startup, rapid response, energy-saving, long service life and environmental efficiency, the LED has been widely used in general lighting, backlight units and decorative lighting. The high-power and high-brightness LEDs have a great prospect in replacing incandescent lamps.

In industry, one way of producing white light is to coat a GaN-based blue LED with a phosphor powder. The GaN-based LED is of two basic structures, i.e., a lateral structure and a vertical structure.

For the LED with a lateral structure, two electrodes are located at the same side of the LED, and the current flows laterally in a GaN layer. As a result, a large resistance and a large quantity of heat will occur.

For the GaN-based LED with a vertical structure, two electrodes are located at both sides of the GaN-based LED respectively, and almost all the currents flow vertically through a GaN-based epitaxial layer. As a result, it is able to obtain uniform current distribution, a reduced resistance, an improved anti-static ability as well as reduced heat and voltage produced by the currents.

Due to the advantages of the GaN-based LED with a vertical structure, many big size companies in the LED industry have been studying the packaging process and manufacturing process for the vertical structure. Currently, there are a large number of packaging structures for the LED, and most of them need to use a gold wire, i.e., the gold wire is welded onto an electrode of the LED chip.

Because the electrode and gold wire welded on a light-extraction surface of the LED chip will prevent a portion of light from passing therethrough, the LED chip will have low light extraction efficiency and poor light extraction consistency. In addition, sophisticated instruments and complex processes are required for welding the gold wire, so the operation process is complicated and the cost is high.

SUMMARY

An object of the embodiments of the present invention is to provide a LED chip packaging structure, its manufacturing method, and a display device, so as to increase thermal conductivity of a LED chip and the overall stability, and to improve a light-extraction effect of a surface of the LED chip.

In one aspect, the embodiments of the present invention provide a LED chip packaging structure, comprising a LED chip unit, and a conductive unit.

The LED chip unit is formed with a first electrode, a GaN layer and a second electrode. The GaN layer is formed between the first electrode and the second electrode, and the first electrode is formed on the GaN layer.

The conductive unit comprises:
a first conductive layer formed at two opposite sides of the first electrode and electrically connected to the first electrode;
a second conductive layer formed at two opposite sides of the second electrode and electrically connected to the second electrode; and
an intermediate isolation layer formed at two opposite sides of the GaN layer and located between the first conductive layer and the second conductive layer.

Preferably, the GaN layer comprises:
a substrate;
a p-type GaN crystal base plate formed on the substrate;
a light-emitting layer formed on the p-type GaN crystal base plate; and
an n-type GaN crystal base plate formed on the light-emitting layer.

Preferably, the first and second conductive layers are made of a transparent conductive material.

Preferably, the intermediate isolation layer is made of a transparent, thermally-conductive, insulating material.

Preferably, the first conductive layer has a thickness identical to the first electrode; and/or the intermediate isolation layer has a thickness identical to the GaN layer; and/or the second conductive layer has a thickness identical to the second electrode.

Preferably, the second electrode is further formed on the second conductive layer.

Preferably, the first conductive layer is further formed on the first electrode.

Preferably, the LED chip packaging structure is disposed in a supporting frame.

The supporting frame comprises a first conductive channel connected to the first conductive layer and a second conductive channel connected to the second conductive layer.

In another aspect, the embodiments of the present invention further provide a method for manufacturing a LED chip packaging structure, comprising:
securing LED chip units at regular intervals in a supporting frame, the LED chip unit being formed with a first electrode, a GaN layer and a second electrode, the GaN layer being formed between the first electrode and the second electrode, and the first electrode being formed on the GaN layer;
forming a second conductive layer included in a conductive unit of the LED chip packaging structure in a region of an upper surface of the supporting frame corresponding to an interval part between any two adjacent LED chip units, the second conductive layer being electrically connected to the second electrode;
forming an intermediate isolation layer included in the conductive unit on the second conductive layer; and
forming a first conductive layer included in the conducting unit on the intermediate isolation layer, the first conductive layer being electrically connected to the first electrode.

Preferably, subsequent to forming the first conductive layer included in the conductive unit, the method further comprises forming a resin fluorescent adhesive layer on the first electrode and the first conductive layer.

In yet another aspect, the embodiments of the present invention further provide a method for manufacturing a LED chip packaging structure, comprising:

forming a hierarchical structure of a conductive unit of the LED chip packaging structure sequentially, the conductive unit comprising a first conductive layer, an intermediate isolation layer and a second conductive layer, the intermediate isolation layer being located between the first conductive layer and the second conductive layer, and the first conductive layer being located on the intermediate isolation layer;

forming a groove in the hierarchical structure of the conductive unit; and disposing the LED chip unit of the LED chip packaging structure in the groove, the LED chip unit comprising a first electrode, a GaN layer and a second electrode, the GaN layer being formed between the first electrode and the second electrode, the first electrode being formed on the GaN layer, the second electrode being electrically connected to the second conductive layer, and the first electrode being electrically connected to the first conductive layer.

Preferably, the groove penetrates through the hierarchical structures of the conductive unit, or the second conductive layer with a predetermined thickness is provided at the bottom of the groove.

In yet another aspect, the embodiments of the present invention further provide a display device comprising the above-mentioned LED chip packaging structure.

According to the LED chip packaging structure, its manufacturing method and the display device of the embodiments of the present invention, the conductive unit is formed at a side of the LED chip unit, and comprises the first conductive layer formed at a side of the first electrode and electrically connected to the first electrode, the second conductive layer formed at a side of the second electrode and electrically connected to the second electrode, and the intermediate isolation layer formed at a side of the GaN layer. The LED chip unit and the conductive unit are connected laterally to form an electrical-connection channel as a whole, without a welding gold wire for the conductive channel in a traditional LED. As a result, it is able to reduce the total thickness of the LED chip device, increase the thermal conductivity of the LED chip and the overall stability, and improve the light-extraction effect of the surface of the LED chip.

BRIEF DESCRIPTION OF THE DRAWINGS

FIG. 3 is a flow chart of a method for manufacturing a LED chip packaging structure according to one embodiment of the present invention;

DETAILED DESCRIPTION

To make the objects, the technical solutions and the advantages of the embodiments of the present invention more apparent, the embodiments of the present invention will be described clearly and completely hereinafter in conjunction with the drawings. Obviously, the followings are merely a part of, rather all of, the embodiments of the present invention. Based on the following embodiments, all the other embodiments obtained by a person skilled in the art without any creative effort also fall in the scope of the present invention.

Unless otherwise defined, all the terms (including technical and scientific terms) used herein have the same meaning as commonly understood by one of ordinary skill in the art to which this invention belongs. The terms "first", "second" and the like used in the specification and claims are intended to differentiate different components, rather than to show the order, number or importance. Also, the terms "one", "one of" and the like are intended to show the presence of at least one element, but cannot be construed as limitation on the number. The terms "connecting", "connected" and the like shall not be limited to physical or mechanical connection, and may also include electrically connection, not matter directly or indirectly. The terms "upper", "lower", "left" and "right" are used herein merely to show the relative position, and when an absolute position of an object to be described is changed, the relative position thereof will be changed correspondingly.

Figure 1:
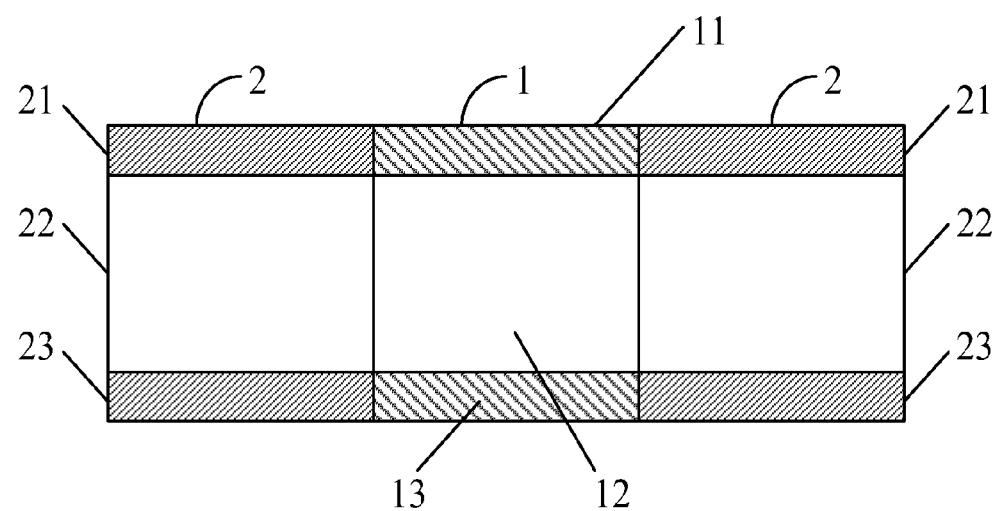
FIG. 1 is a schematic view showing the structure of a LED chip packaging structure according to one embodiment of the present invention.

The embodiment of the present invention provides a LED chip packaging structure which, as shown in FIG. 1, comprises a LED chip unit 1 and a conductive unit 2.

A first electrode 11, a GaN layer 12 and a second electrode 13 are formed on the LED chip unit 1, the GaN layer 12 is formed between the first electrode 11 and the second electrode 13, and the first electrode 11 is formed on the GaN layer 12.

The conductive unit 2 comprises:

a first conductive layer 21 formed at two opposite sides of the first electrode 11 and electrically connected to the first electrode;

a second conductive layer 23 formed at two opposite sides of the second electrode 13 and electrically connected to the second electrode; and an intermediate isolation layer 22 formed at two opposite sides of the GaN layer 12 and located between the first conductive layer 21 and the second conductive layer 23.

According to the LED chip packaging structure of the embodiment of the present invention, the conductive unit is arranged at a side of the LED chip unit, so that the conductive unit is laterally connected to the layers electrically connected with each other in the LED chip unit to form an electrical-connection channel as a whole, without a welding gold wire for the conductive channel in a traditional LED. As a result, it is able to reduce the total thickness of the LED chip device, increase the thermal conductivity of the LED chip and the overall stability, and improve the light-extraction effect of the surface of the LED chip.

The side mentioned in the embodiment of the present invention may be an outside of a layer in the horizontal direction (e.g., the left or right side of the first electrode 11 as shown in FIG. 1), or a top of the layer (e.g., an upper side of the GaN layer 12, i.e., the side close to the first electrode 11, as shown in FIG. 1), or a bottom of the layer (e.g., a lower side of the GaN layer 12, i.e., the side close to the second electrode 12, as shown in FIG. 1).

It should be appreciated that, when a setting angle for the LED chip unit 1 is changed, the sides of the LED chip unit 1 will be changed too.

Figure 2:
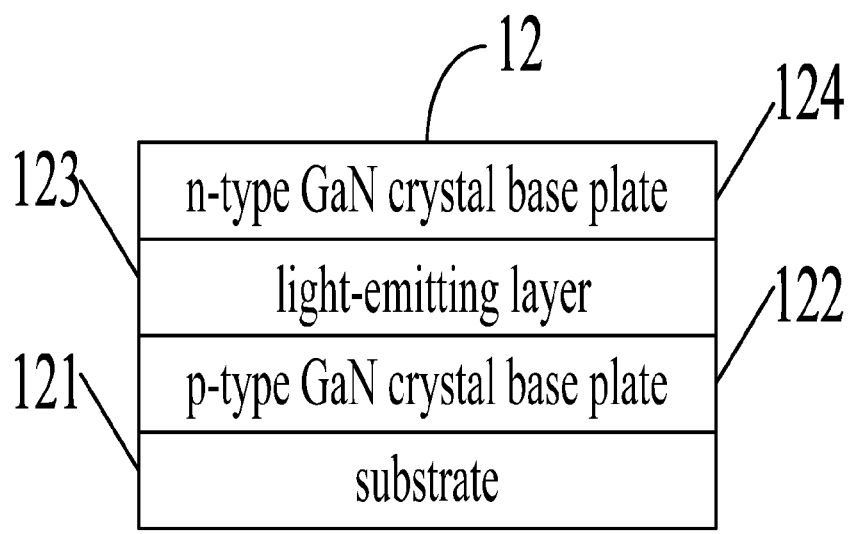
FIG. 2 is a schematic view showing the structure of a GaN layer in the LED chip packaging structure according to one embodiment of the present invention.

In an alternative embodiment, the GaN layer 12, as shown in FIG. 2, may comprise:

a substrate 121;

a p-type GaN crystal base plate 122 formed on the substrate 121;

a light-emitting layer 123 formed on the p-type GaN crystal base plate 122; and an n-type GaN crystal base plate 124 formed on the light-emitting layer 123.

In another alternative embodiment, the first conductive layer 21 and the second conductive layer 23 may be made of a transparent conductive material, so that the LED chip unit 1 can emit light normally without any influence from the conductive unit 2.

In yet another alternative embodiment, the intermediate isolation layer 22 may be made of a transparent, thermally-conductive, insulating material.

Hierarchical structures of the conductive unit 2 surround tightly the LED chip unit 1, and the intermediate isolation layer 22 of the conductive unit 2 may be made of a transparent, thermally-conductive, insulating material, so according to the LED packaging structure of the embodiment of the present invention, the LED chip unit 1 can dissipate heat not only through its upper and lower sides (i.e., the top side facing the first electrode 11, and the bottom side facing the second electrode 13), but also through the other sides (i.e., the intermediate isolation layer 22). As a result, the ability of the LED chip unit 1 to dissipate heat to the surroundings will be improved, thereby the LED will operate more stably with a longer service life.

In addition, in order to achieve better conductive and heat-dissipating functions of the conductive unit 2, the thickness of each layer in the conductive unit 2 may be identical to that of each layer in the corresponding LED chip.

To be specific, the first conductive layer 21 may have a thickness identical to the first electrode 11, the intermediate isolation layer 22 may have a thickness identical to the GaN layer 12, and the second conductive layer 23 may have a thickness identical to the second electrode 13.

It should be appreciated that, the first conductive layer 21 may also have a thickness greater than or less than the first electrode 11, and so does the thickness relationship between the second conductive layer 23 and the second electrode 13, or between the intermediate isolation layer 22 and the GaN layer 12.

In a word, the layers may have any thickness as long as the beneficial effect mentioned in the embodiment of the present invention can be achieved, e.g., to ensure an electrical connection between the first conductive layer 21 and the first electrode 11, and to ensure better heat dissipation of the intermediate isolation layer 22.

Figure 7:
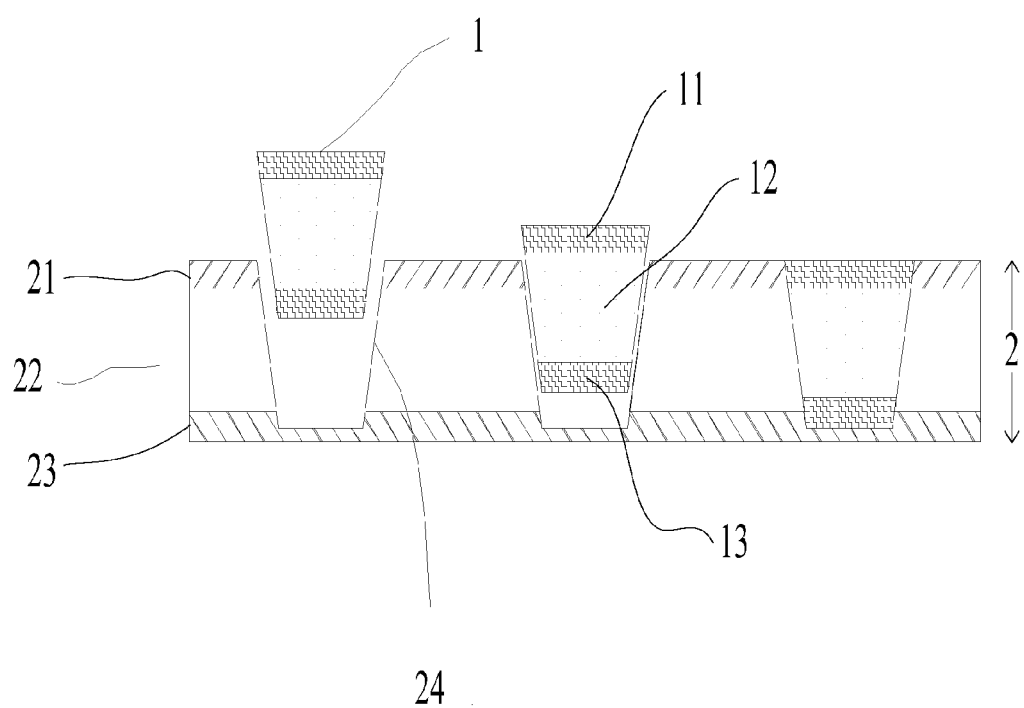
FIG. 7 is a schematic view showing the implementation of the method for manufacturing the LED chip packaging structure according to one embodiment of the present invention.

The second electrode 13 may also be formed on the second conductive layer 23, as shown in FIG. 7, so as to achieve an electrical connection between the second conductive layer 23 and the second electrode 13 in a better manner.

Also, the first conductive layer 21 may be formed on the first electrode 11 in the embodiment of the present invention.

Figure 4:
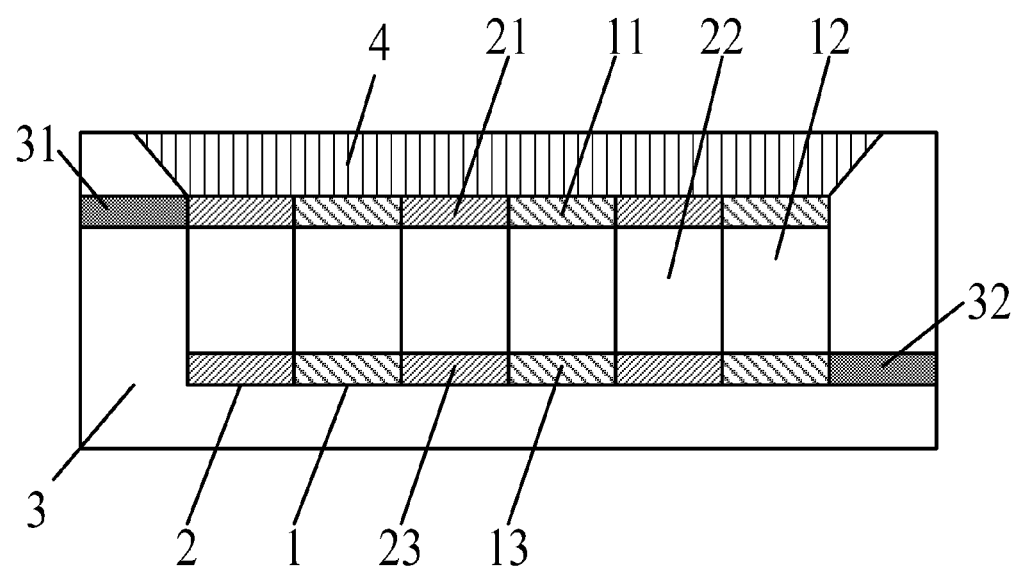
FIG. 4 is another schematic view showing the structure of the LED chip packaging structure according to one embodiment of the present invention.

In an alternative embodiment, the LED chip packaging structure of the embodiment of the present invention may be arranged in a supporting frame 3 (as shown in FIG. 4).

The supporting frame 3 may comprise:

a first conductive channel 31 and a second conductive channel 32, wherein the first conductive channel 31 is connected to the first conductive layer 21, and the second conductive channel 32 is connected to the second conductive layer 23, so that the LED chip packing structure can be connected to an external circuit to form a circuit path for the entire LED device.

The embodiment of the present invention further provides a method for manufacturing a LED chip packaging structure, which, as shown in FIG. 3 in combination with FIG. 4, comprises:

Step 3a: securing the LED chip units 1 at a regular interval in the supporting frame 3, the LED chip unit 1 being formed with the first electrode 11, the GaN layer 12 and the second electrode 13, the GaN layer 12 being formed between the first electrode 11 and the second electrode 13, and the first electrode 11 being formed on the GaN layer 12;

Step 3b: forming the second conductive layer 23 included in the conductive unit 2 of the LED chip packaging structure in a region of an upper surface of the supporting frame 3 corresponding to an interval part between any two adjacent LED chip units 1, the second conductive layer 23 being electrically connected to the second electrode 13;

Step 3c: forming the intermediate isolation layer 22 included in the conductive unit 2 on the second conductive layer 23; and Step 3d: forming the first conductive layer 21 included in the conducting unit 2 on the intermediate isolation layer 22, the first conductive layer 21 being electrically connected to the first electrode 11.

According to the method of the embodiment of the present invention, the layers included in the conductive unit 2 are formed sequentially around the LED chip unit 1, and each layer in the conductive unit 2 surrounds tightly the corresponding layer in the LED chip unit 1. As a result, a welding gold wire for the conductive channel in a traditional LED may be omitted, thereby it is able to reduce the total thickness of the LED chip device, increase the thermal conductivity effect of the LED chip and the overall stability, and improve the light-extraction effect of the surface of the LED chip.

In the embodiment, the layers (including 21, 22 and 23) of the conductive unit 2 may be made by various methods such as electroplating and vapor deposition.

Figure 5:
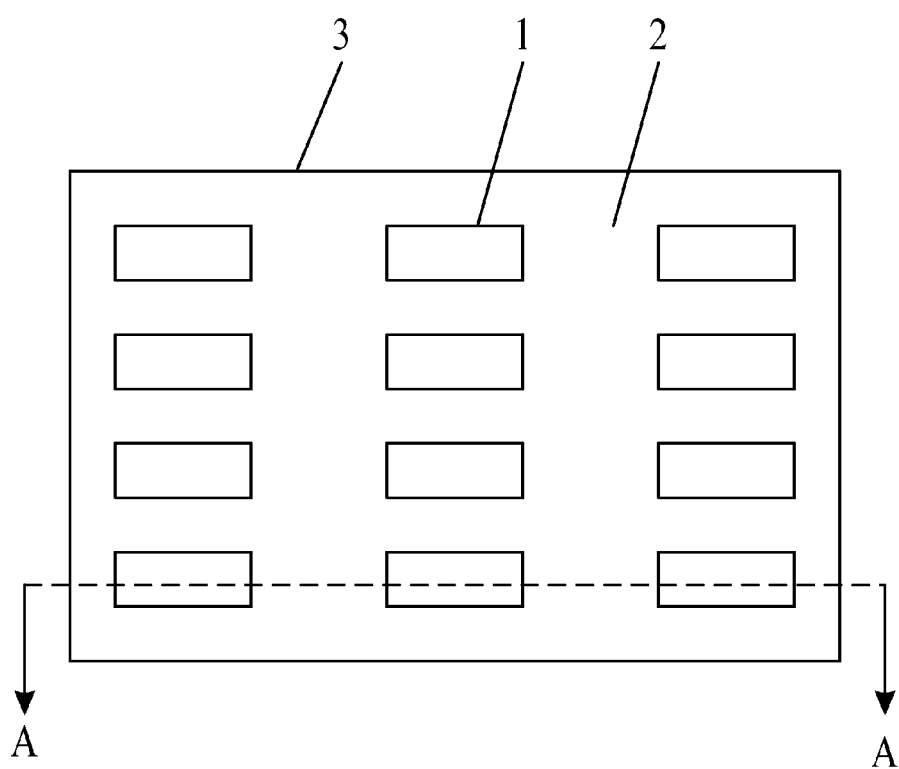
FIG. 5 is yet another schematic view showing the structure of the LED chip packaging structure according to one embodiment of the present invention.

FIG. 4 shows the LED chip packaging structure manufactured by the method according to one embodiment of the present invention (FIG. 4 is a sectional view taken along line A-A in FIG. 5).

Subsequent to forming the first conductive layer 21 included in the conductive unit 2, the method further comprises forming a resin fluorescent adhesive layer 4 on the first electrode 11 and the first conductive layer 21.

The supporting frame 3 concerned in the method may also comprise the first conductive channel 31 and the second conductive channel 32, wherein the first conductive channel 31 is connected to the first conductive layer 21 of the conductive unit 2, and the second conductive channel 32 is connected to the second conductive layer 23 of the conductive unit 2, so that the LED chip packing structure provided by the embodiment can be connected to an external circuit to form a circuit path for the entire LED device.

In an alternative embodiment, as shown in FIG. 5 (FIG. 4 is a sectional view taken along line A-A in FIG. 5), in a display device provided with the supporting frame 3, a plurality of LED chips 1 may be provided at a predetermined position of the supporting frame 3, then the entire hierarchical structures of the conductive unit 2 may be arranged, so that a plurality of LED chip packaging structures can be manufactured at the same time.

Figure 6:
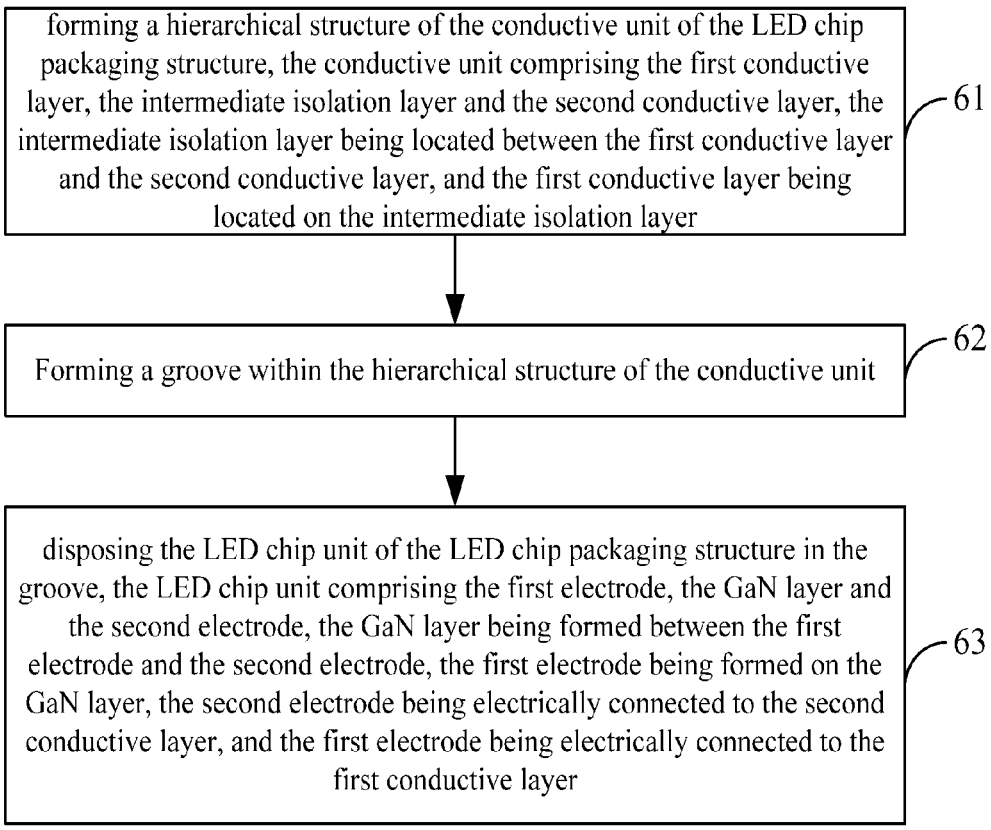
FIG. 6 is another flow chart of the method for manufacturing the LED chip packaging structure according to one embodiment of the present invention.

The embodiment of the present invention further provides a method for manufacturing a LED chip packaging structure, which, as shown in FIG. 6 in combination with FIG. 7, comprises:

Step 61: forming hierarchical structures of the conductive unit 2 of the LED chip packaging structure, the conductive unit 2 comprising the first conductive layer 21, the intermediate isolation layer 22 and the second conductive layer 23, the intermediate isolation layer 22 being located between the first conductive layer 21 and the second conductive layer 23, and the first conductive layer 21 being located on the intermediate isolation layer 22;

Step 62: forming grooves 24 in the hierarchical structures of the conductive unit 2; and Step 63: disposing the LED chip units 1 of the LED chip packaging structure in the grooves 24, respectively, the LED chip unit 1 comprising the first electrode 11, the GaN layer 12 and the second electrode 13, the GaN layer 12 being formed between the first electrode 11 and the second electrode 13, the first electrode 11 being formed on the GaN layer 12, the second electrode 13 being electrically connected to the second conductive layer 23, and the first electrode 11 being electrically connected to the first conductive layer 21.

According to the method of the embodiment of the present invention, the hierarchical structures of the conductive unit 2 in the LED chip packaging structure are manufactured at first, and then the LED chip units 1 are disposed in the grooves 24 formed in the hierarchical structures, respectively, so that each layer included in the conductive unit 2 surrounds tightly the corresponding layer in the LED chip unit 1. As a result, a welding gold wire for the conductive channel in a traditional LED may be omitted, thereby it is able to reduce the total thickness of the LED chip device, increase the thermal conductivity effect of the LED chip and the overall stability, and improve the light-extraction effect of the surface of the LED chip.

FIG. 7 shows the implementation of the method for manufacturing the LED chip packaging structure according to one embodiment of the present invention.

As shown in FIG. 7, the bottom of the groove 24 may be provided with the second conductive layer 23 with a predetermined thickness, so that the second conductive layer 23 can be electrically connected not only to the side but also the bottom of the second electrode 13.

In addition, the groove 24 may penetrate through the hierarchical structures of the conductive unit 2, so that each layer in the conductive unit 2 can be laterally connected to the corresponding layer in the LED chip unit 1.

In the embodiment, the layers in the conductive unit 2 may be made by various methods such as electroplating and vapor deposition.

The groove 24 may be formed by the methods such as laser cutting and photoetching.

The embodiment of the present invention further provides a display device comprising the above-mentioned LED chip packaging structure. The display device may be any products or parts having the display function, such as a liquid crystal display panel, a liquid crystal television, a liquid crystal display, an electrode paper, a digital photo frame, a mobile phone and a tablet PC.

According to the LED chip packaging structure, its manufacturing method and the display device of the present invention, the conductive unit is formed at the side of the LED chip unit, and comprises the first conductive layer formed at a side of the first electrode and electrically connected to the first electrode, the second conductive layer formed at a side of the second electrode and electrically connected to the second electrode, and the intermediate isolation layer formed at a side of the GaN layer. The LED chip unit and the conductive unit are connected laterally to form an electrical-connection channel as a whole, without a welding gold wire for the conductive channel in a traditional LED. As a result, it is able to reduce the total thickness of the LED chip device, increase the thermal conductivity effect of the LED chip and the overall stability, and improve the light-extraction effect of the surface of the LED chip.

The above are merely the preferred embodiments of this invention. It should be noted that, a person skilled in the art may make improvements and modifications without departing from the principle of the present invention, and these improvements and modifications shall also be considered as the scope of the present invention.

What is claimed is:

1. A LED chip packaging structure, comprising a LED chip unit and a conductive unit, wherein the LED chip unit is formed with a first electrode, a GaN layer and a second electrode, the GaN layer is formed between the first electrode and the second electrode, and the first electrode is formed on the GaN layer, the conductive unit comprises:

a first conductive layer formed at two opposite sides of the first electrode and electrically connected to the first electrode;

a second conductive layer formed at two opposite sides of the second electrode and electrically connected to the second electrode; and an intermediate isolation layer formed at two opposite sides of the GaN layer and located between the first conductive layer and the second conductive layer; wherein the LED chip packaging structure is disposed in a supporting frame, the supporting frame comprises: a first conductive channel connected to the first conductive layer and a second conductive channel connected to the second conductive layer.

2. The LED chip packaging structure according to claim 1, wherein the GaN layer comprises:

a substrate;

a p-type GaN crystal base plate formed on the substrate;

a light-emitting layer formed on the p-type GaN crystal base plate; and an n-type GaN crystal base plate formed on the light-emitting layer.

3. The LED chip packaging structure according to claim 1, wherein the first and second conductive layers are made of a transparent conductive material.

4. The LED chip packaging structure according to claim 1, wherein the intermediate isolation layer is made of a transparent, thermally-conductive, insulating material.

5. The LED chip packaging structure according to claim 1, wherein the first conductive layer has a thickness identical to the first electrode; and/or the intermediate isolation layer has a thickness identical to the GaN layer; and/or the second conductive layer has a thickness identical to the second electrode.

6. The LED chip packaging structure according to claim 1, wherein the second electrode is further formed on the second conductive layer.

7. The LED chip packaging structure according to claim 1, wherein the first conductive layer is further formed on the first electrode.

8. A display device comprising the LED chip packaging structure according to claim 1.

9. The display device according to claim 8, wherein the GaN layer comprises:
   a substrate;
   a p-type GaN crystal base plate formed on the substrate;
   a light-emitting layer formed on the p-type GaN crystal base plate; and
   an n-type GaN crystal base plate formed on the light-emitting layer.

10. The display device according to claim 8, wherein the first and second conductive layers are made of a transparent conductive material.

11. The display device according to claim 8, wherein the intermediate isolation layer is made of a transparent, thermally-conductive, insulating material.

12. The display device according to claim 8, wherein the first conductive layer has a thickness identical to the first electrode; and/or
   the intermediate isolation layer has a thickness identical to the GaN layer; and/or
   the second conductive layer has a thickness identical to the second electrode.

13. The display device according to claim 8, wherein the second electrode is further formed on the second conductive layer.

14. The display device according to claim 8, wherein the first conductive layer is further formed on the first electrode.

15. A method for manufacturing a LED chip packaging structure, comprising:
   securing LED chip units at regular intervals in a supporting frame, the LED chip unit being formed with a first electrode, a GaN layer and a second electrode, the GaN layer being formed between the first electrode and the second electrode, and the first electrode being formed on the GaN layer;
   forming a second conductive layer included in a conductive unit of the LED chip packaging structure in a region of an upper surface of a supporting frame corresponding to an interval part between any two adjacent LED chip units, the second conductive layer being electrically connected to the second electrode;
   forming an intermediate isolation layer included in the conductive unit on the second conductive layer; and
   forming a first conductive layer included in the conducting unit on the intermediate isolation layer, the first conductive layer being electrically connected to the first electrode; wherein the LED chip packaging structure is disposed in a supporting frame, the supporting frame comprises: a first conductive channel connected to the first conductive layer and a second conductive channel connected to the second conductive layer.

16. The method according to claim 15, wherein subsequent to forming the first conductive layer included in the conductive unit, the method further comprises:
   forming a resin fluorescent adhesive layer on the first electrode and the first conductive layer.

17. A method for manufacturing a LED chip packaging structure, comprising:
   forming a hierarchical structure of a conductive unit of the LED chip packaging structure sequentially, the conductive unit comprising a first conductive layer, an intermediate isolation layer and a second conductive layer, the intermediate isolation layer being located between the first conductive layer and the second conductive layer, and the first conductive layer being located on the intermediate isolation layer;
   forming a groove in the hierarchical structure of the conductive unit; and
   disposing the LED chip unit of the LED chip packaging structure in the groove, the LED chip unit comprising a first electrode, a GaN layer and a second electrode, the GaN layer being formed between the first electrode and the second electrode, the first electrode being formed on the GaN layer, the second electrode being electrically connected to the second conductive layer, and the first electrode being electrically connected to the first conductive layer; wherein the LED chip packaging structure is disposed in a supporting frame, the supporting frame comprises: a first conductive channel connected to the first conductive layer and a second conductive channel connected to the second conductive layer.

18. The method according to claim 17, wherein the groove penetrates through the hierarchical structure of the conductive unit, or
   the second conductive layer with a predetermined thickness is provided at the bottom of the groove.

* * * * *